(12) United States Patent
Edwards et al.

(10) Patent No.: US 7,394,666 B2
(45) Date of Patent: Jul. 1, 2008

(54) CIRCUIT BOARD CAM-ACTION STANDOFF CONNECTOR

(75) Inventors: David L. Edwards, Poughkeepsie, NY (US); Ronald L. Hering, Pleasant Valley, NY (US); David C. Long, Wappingers Falls, NY (US); Jason S. Miller, Poughkeepsie, NY (US); Carl R. Peterson, Cupertino, CA (US)

(73) Assignees: International Business Machines Corporation, Armonk, NY (US); Apple Computer, Inc., Cupertino, CA (US)

( * ) Notice: Subject to any disclaimer, the term of this patent is extended or adjusted under 35 U.S.C. 154(b) by 452 days.

(21) Appl. No.: 10/904,276

(22) Filed: Nov. 2, 2004

(65) Prior Publication Data

US 2006/0090927 A1     May 4, 2006

(51) Int. Cl.
*H05K 1/11*  (2006.01)
(52) U.S. Cl. ............................ 361/803; 174/138; 174/87
(58) Field of Classification Search ................. 361/803, 361/413; 339/91
See application file for complete search history.

(56) References Cited

U.S. PATENT DOCUMENTS

| | | | |
|---|---|---|---|
| 3,675,531 A | 7/1972 | Lehman | |
| 4,168,877 A * | 9/1979 | Little et al. | 439/347 |
| 4,664,458 A * | 5/1987 | Worth | 439/82 |
| 4,677,527 A * | 6/1987 | Pasterchick et al. | 361/737 |
| 4,682,847 A * | 7/1987 | Moore et al. | 439/271 |
| 4,726,722 A | 2/1988 | Wollar | |
| 4,784,550 A | 11/1988 | Wollar | |
| 4,970,761 A | 11/1990 | Nakamura | |
| 5,754,412 A | 5/1998 | Clavin | |
| 5,973,926 A * | 10/1999 | Sacherman et al. | 361/759 |
| 6,024,603 A | 2/2000 | Chen et al. | |
| 6,183,285 B1 | 2/2001 | Szu | |
| 6,215,667 B1 * | 4/2001 | Ady et al. | 361/752 |
| 6,362,978 B1 * | 3/2002 | Boe | 361/825 |
| 6,652,206 B2 | 11/2003 | Heflin et al. | |
| 2002/0027017 A1 | 3/2002 | Petri | |
| 2003/0156917 A1 | 8/2003 | Heflin et al. | |

FOREIGN PATENT DOCUMENTS

EP          1338804 A1    8/2003

* cited by examiner

*Primary Examiner*—Dean A. Reichard
*Assistant Examiner*—Abiy Getachew
(74) *Attorney, Agent, or Firm*—Joseph Petrokaitis; Hoffman Warnick LLC

(57) ABSTRACT

A cam-action expanding standoff connector and related method are disclosed for mounting a circuit board. The standoff connector includes a body and a plurality of mounting members having interior longitudinally-extending camming portions for engagement by a cam. A cam is configured to be positioned within the mounting members in a first position in which the mounting members are not expanded against the interior of a mounting opening and in a second position in which the cam engages the camming portions to expand the plurality of mounting members against the interior of the mounting opening. Since the camming action is horizontal only (purely radial), practically no vertical forces are applied to the circuit board and a best-fit alignment between a circuit board and heatsink can be established and maintained.

16 Claims, 7 Drawing Sheets

CIRCUIT BOARD CAM-ACTION STANDOFF CONNECTOR

TECHNICAL FIELD

The present invention relates generally to circuit board connectors, and more particularly, to a cam-action expandable standoff connector for mounting a circuit board.

RELATED ART

Electronic circuit board assembly requires the ability to securely lock a circuit board in place for proper operation. For example, typical personal computer (PC) circuit board operation requires locking the board into position after it, and in particular a chip connected thereto, has been "best-fit" to a copper heatsink or coldplate. The term "best-fit" refers to how the circuit board is coupled to the heatsink via thermal transmission materials in a near-perfectly parallel fashion. Establishing a thin, uniform thermal interface between chip and heatsink is critical for achieving adequate thermal performance for high powered applications. Variable height standoffs are sometimes used to accommodate variations in stack-up height and tilt. Non-parallelism between chip and heatsink will increase a thermal interface gap, thus decreasing thermal performance. Variable position standoffs enable parallel assembly between chip and heatsink while accommodating non-parallelism between circuit card and chassis. Referring to FIG. 1, one conventional approach for locking a circuit board 6 into position is shown. Circuit board 6 includes a chip 8 mounted to a heatsink or coldplate 10 via thermal transmission material. In this approach, as shown in FIG. 2, split expanding plastic standoff connectors 12 are used to mount circuit board 6. Returning to FIG. 1, in this setting, expanding plastic standoff connectors 12 are mounted to a chassis 14 and mounting openings 16 of circuit board 6 are placed over ends 18 of standoff connectors 12. As shown in FIG. 2, as threaded fastener 20 is tightened into end 18 of a standoff connector 12, slit portion 22 of standoff connector 12 expands against an interior of mounting opening 16. A drawback of this type mount is that, as standoff connector 12 expands, it tends to move circuit board 6 vertically and disturb the best-fit alignment of circuit board 6 (i.e., chip 8 thereof) to the heatsink/coldplate. For example, slit portion 22 tends to vertically move (with a V-shaped expansion profile) the circuit board 6 rather than simply horizontally clamp it in position.

In view of the foregoing, there is a need in the art for a standoff connector for maintaining a best-fit alignment between a circuit board and heatsink.

SUMMARY OF THE INVENTION

The invention includes a cam-action expanding standoff connector and related method for mounting a circuit board. The standoff connector includes a body and a plurality of mounting members having interior longitudinally-extending camming portions for engagement by a cam. A cam is configured to be positioned within the mounting members in a first position in which the mounting members are not expanded against the interior of a mounting opening and in a second position in which the cam engages the camming portions to expand the plurality of mounting members against the interior of the mounting opening. Since the camming action is horizontal only (purely radial), practically no vertical forces are applied to the circuit board and a best-fit alignment between a circuit board and heatsink can be established and maintained.

A first aspect of the invention is directed to an expanding standoff connector for mounting a circuit board, the connector comprising: a body adapted to be mounted to a chassis; an engagement portion coupled to the body for placement within an interior of a mounting opening of the circuit board, the engagement portion including a cam opening between a plurality of mounting members, each mounting member having an interior longitudinally-extending camming portion; and a cam including a longitudinally-extending engager for each camming portion; wherein the cam is configured to be positioned in the cam opening in a first position in which the mounting members are not expanded against the interior of the mounting opening and in a second position in which each engager engages a corresponding camming portion to expand the plurality of mounting members against the interior of the mounting opening.

A second aspect of the invention includes a method for mounting a circuit board using an expandable standoff connector, the method comprising the steps of: mounting a body of the expandable standoff connector to a chassis; inserting an engagement portion of the expandable standoff connector within an interior of a mounting opening of the circuit board, the engagement portion including a cam opening between a plurality of mounting members, each mounting member having an interior longitudinally-extending camming portion; providing a cam within the cam opening, the cam including a longitudinally-extending engager for each camming portion; and moving the cam from a first position in which the mounting members are not expanded against the interior of the mounting opening and in a second position in which each engager engages a corresponding camming portion to expand the plurality of mounting members against the interior of the mounting opening to mount the circuit board.

A third aspect of the invention includes an expanding standoff connector for mounting a circuit board, the connector comprising: a body adapted to be mounted to a chassis; a plurality of mounting members extending from the body for placement within an interior of a mounting opening of the circuit board, the plurality of mounting members having a cam opening therebetween, each mounting member having an interior longitudinally-extending camming portion having a decreasing distance relative to a center of the cam opening; and a cam for positioning in the cam opening in a first position in which the mounting members are not expanded against the interior of the mounting opening, and for rotation to a second position in which the cam engages each camming portion to expand the plurality of mounting members against the interior of the mounting opening.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
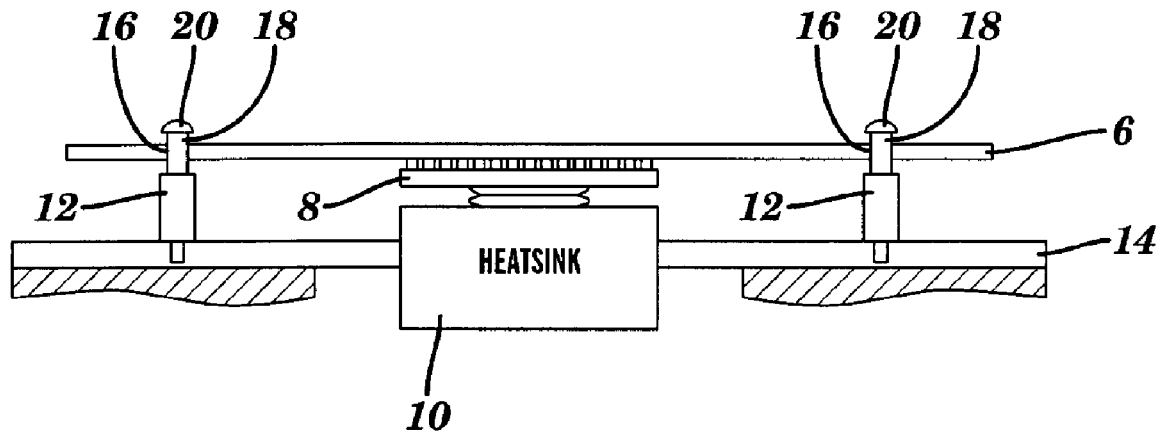
FIG. 1 shows a side view of a conventional circuit board expanding standoff connector.
Figure 2:
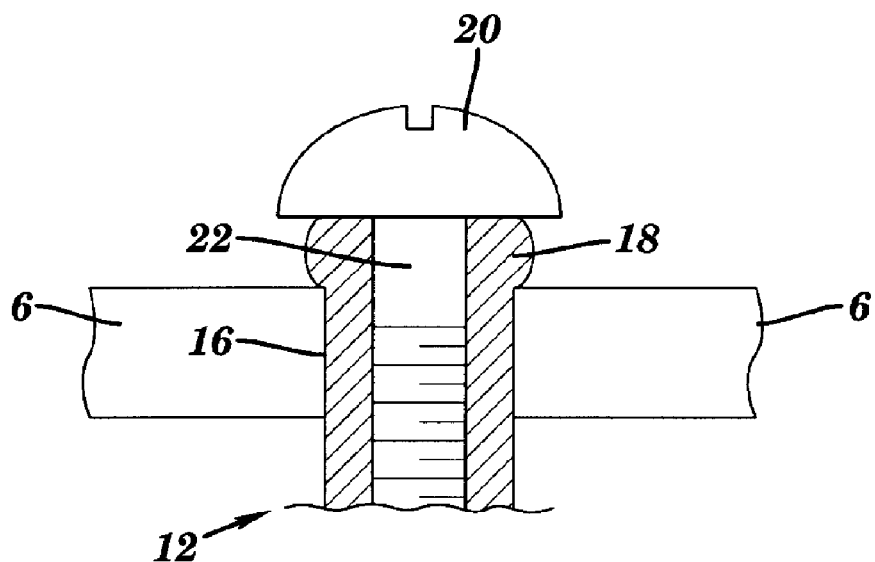
FIG. 2 shows a detailed side view of the connector of FIG. 1.
Figure 3:
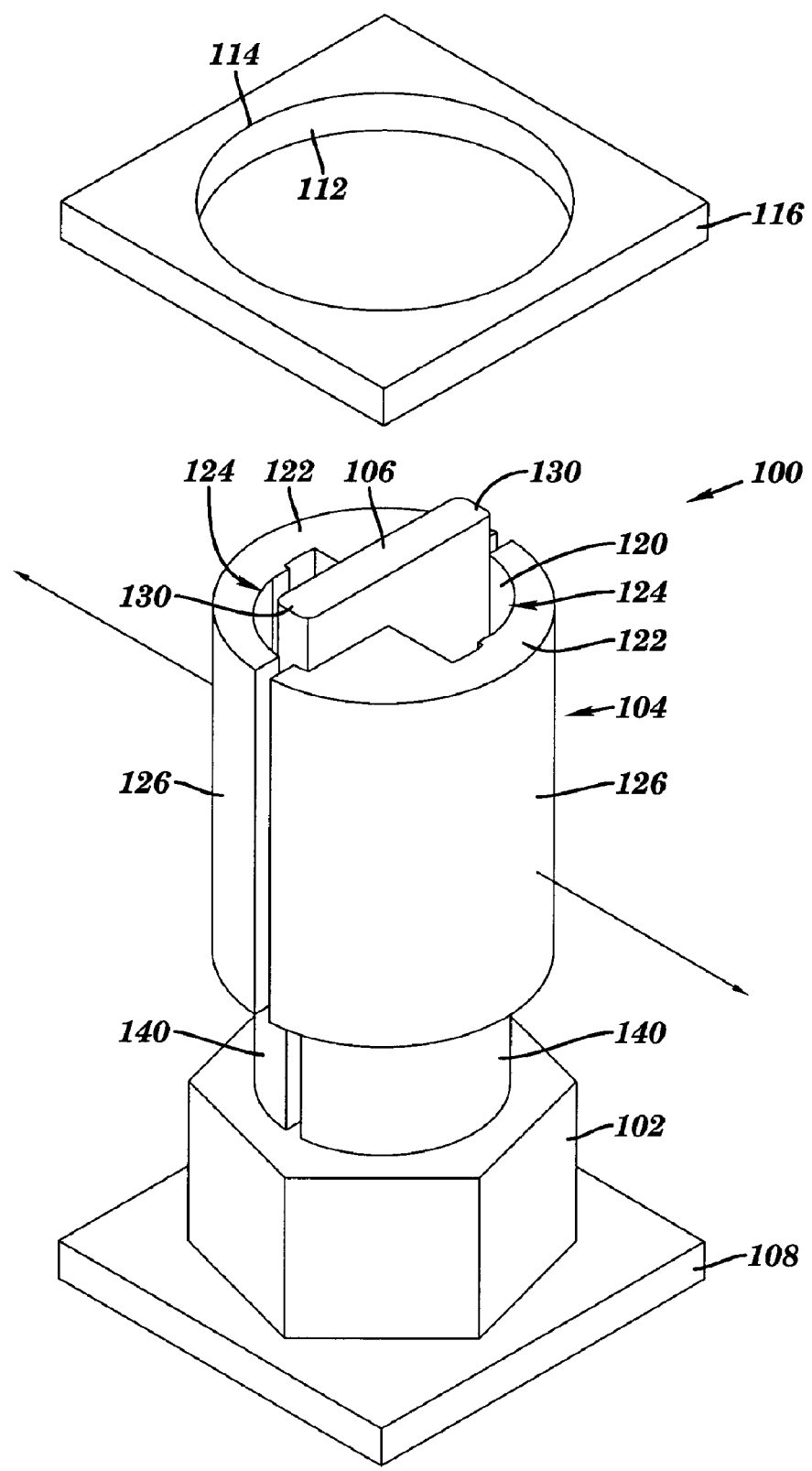
FIG. 3 shows a perspective view of a first embodiment of a cam-action standoff connector according to the invention in a non-actuated position.

With reference to the accompanying drawings, FIG. 3 shows an expanding standoff connector 100 for mounting a circuit board 116. Connector 100 includes a body 102, an engagement portion 104 and a cam 106. Body 102 is adapted to be mounted to a chassis 108 such as a chassis of a personal computer, in any now known or later developed fashion. For example, body 102 may be snap-fit or bolted to chassis 108.

Figure 4:
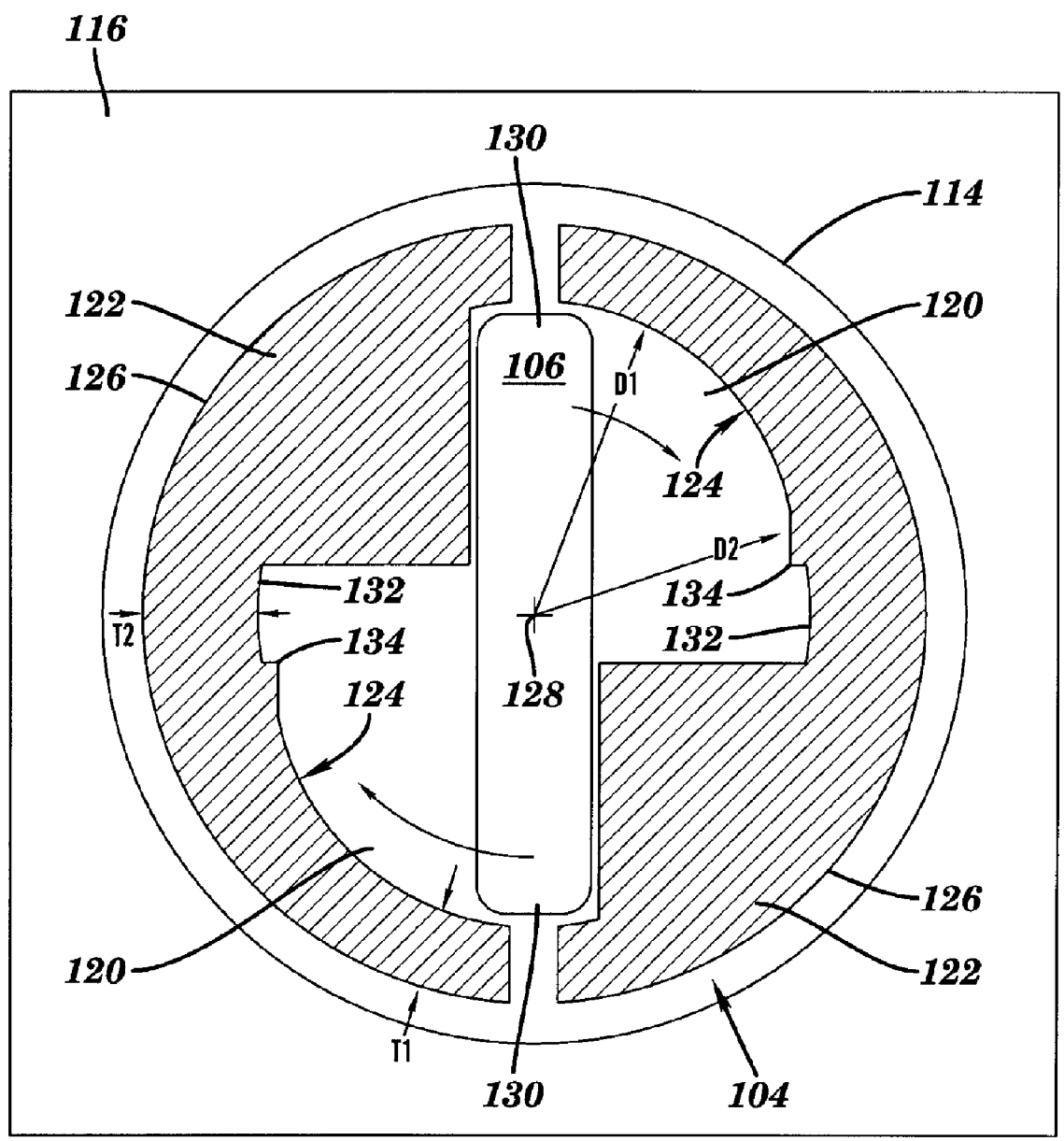
FIG. 4 shows a plan view of the connector of FIG. 3 in a non-actuated position.

Engagement portion 104 is integrally coupled to body 102 and is configured for placement within an interior 112 of a mounting opening 114 of circuit board 116. Engagement portion 104 includes a cam opening 120 between a plurality of mounting members 122 thereof. Each mounting member 122 includes an interior longitudinally-extending camming portion 124. In one embodiment, an exterior surface 126 of connector 100 has substantially the same shape as a mating portion of mounting opening 114. As shown in FIG. 4, each camming portion 124 has a decreasing distance (D2 vs. D1) relative to a center 128 of cam opening 120. In other words, each camming portion 124 has a first thickness T1 relative to exterior surface 126 at a first position, and a second, greater thickness T2 at a second position relative to exterior surface 126.

Figure 5:
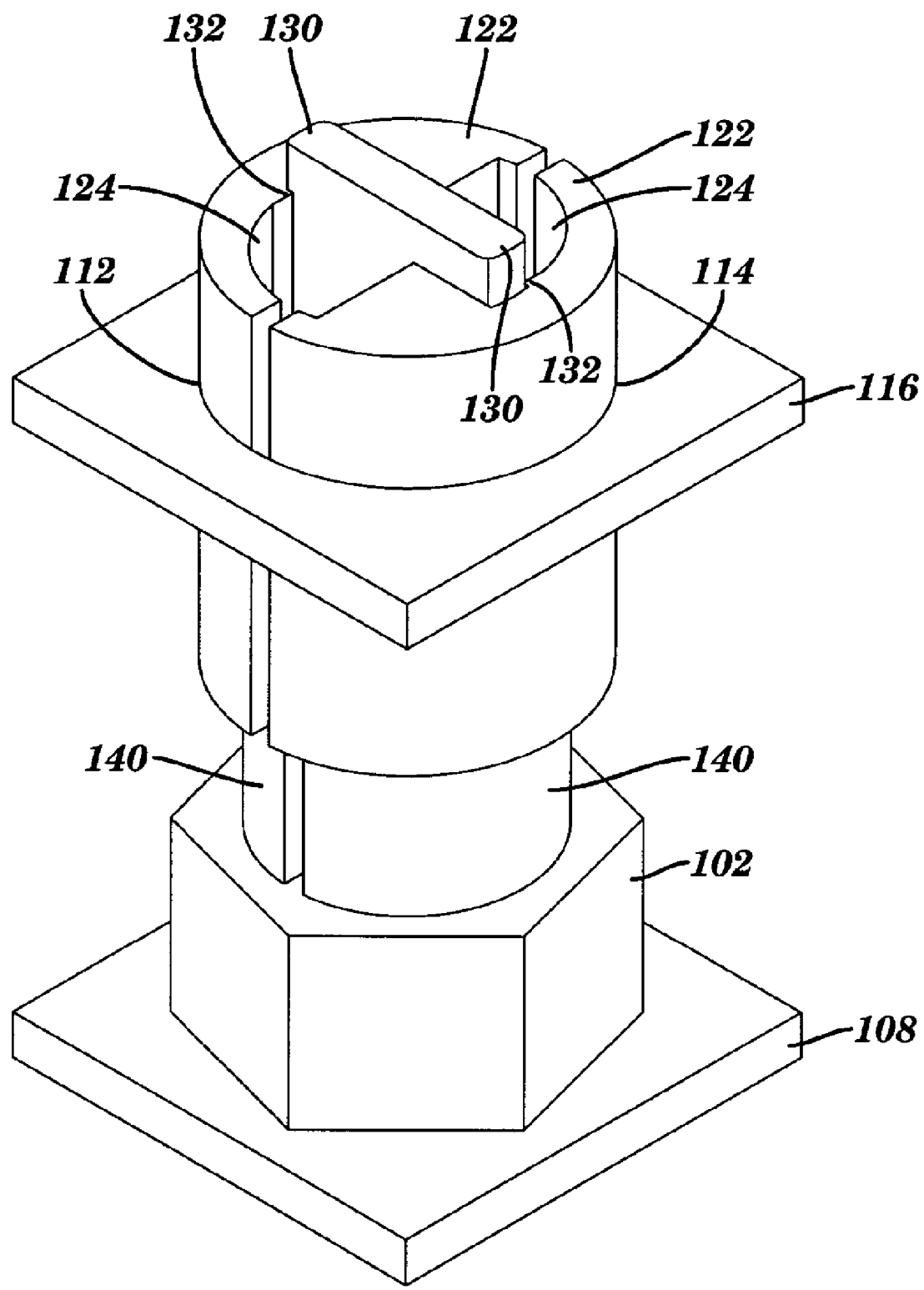
FIG. 5 shows a perspective view of the connector of FIGS. 3-4 in an actuated position.

Cam 106 includes a longitudinally-extending engager 130 for each camming portion 124. In operation, cam 106 is configured to be placed or provided in cam opening 120 in a first non-actuated position (FIGS. 3 and 4) in which mounting members 122 are not expanded against interior 112 of mounting opening 114. As shown in FIG. 5, cam 106 is rotatable about a longitudinal axis (center of cam opening 128) to a second, actuated position in which each engager 130 engages a corresponding camming portion 124 to expand mounting members 122 against interior 112 of mounting opening 114 to securely mount circuit board 116. That is, mounting members 122 are forced radially via each camming portion 124. Cam 106 can be rotated by any tool capable of grasping an upper end thereof, e.g., pliers, a socket having a negative image of the cam cross-section, etc. As shown in FIGS. 3 and 4, each camming portion 124 may also include an engager seat 132 formed by a ridge or similar structure 134 in camming portion 124 for securing cam 106 in the second position. In an alternate embodiment (not shown), multiple engager seats providing locking positions of increasing degrees of expansion could be provided.

Figure 6:
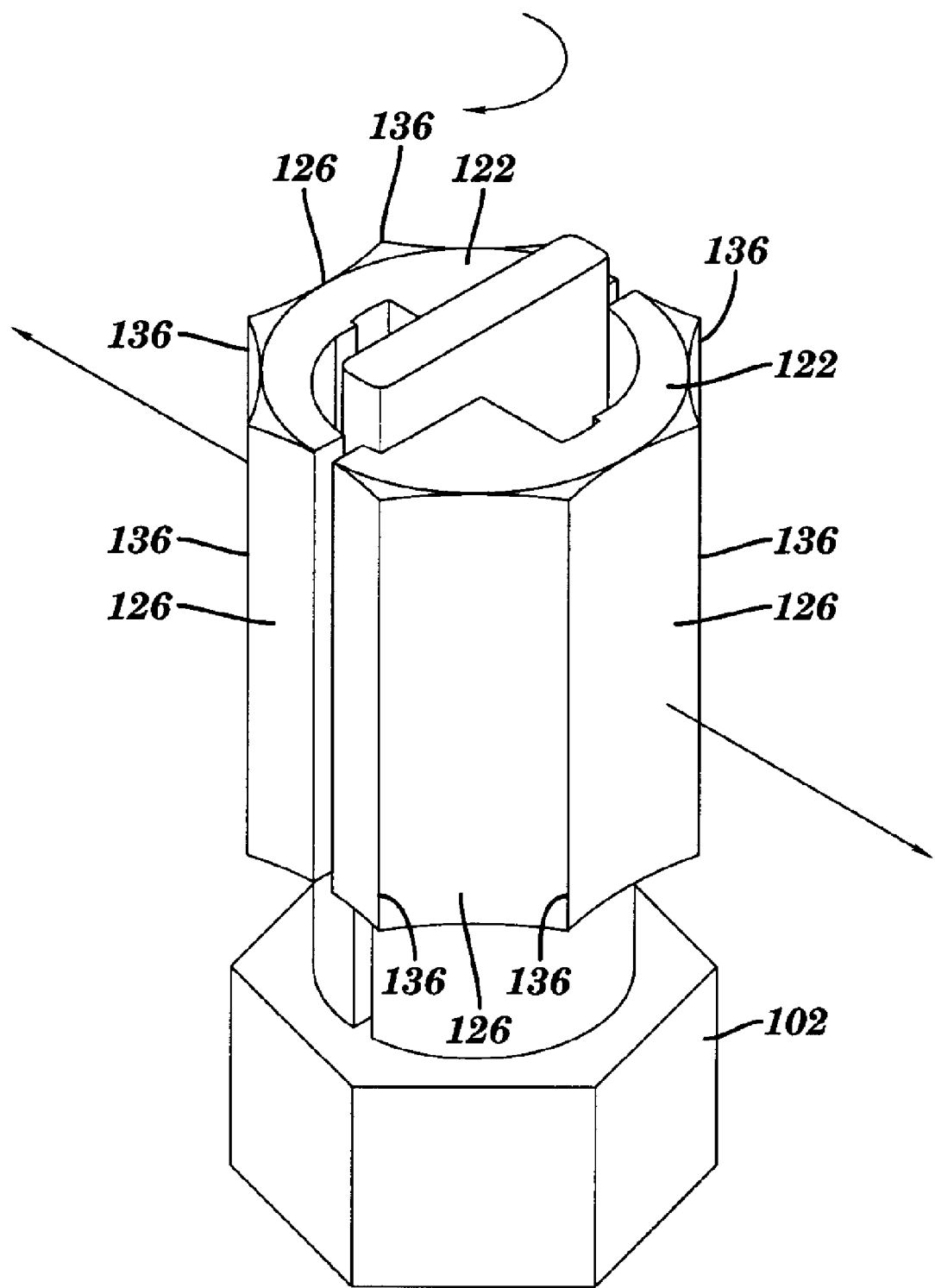
FIG. 6 shows a perspective view of an alternative embodiment of the connector of FIG. 3.

As noted above, in one embodiment, shown in FIGS. 3-5, exterior surface 126 has substantially the same shape as a mating portion of mounting opening 114. However, in an alternative embodiment shown in FIG. 6, each mounting member 122 may include at least one spline 136 on exterior surface 126 to assist in engagement of mounting opening 114.

Figure 7:
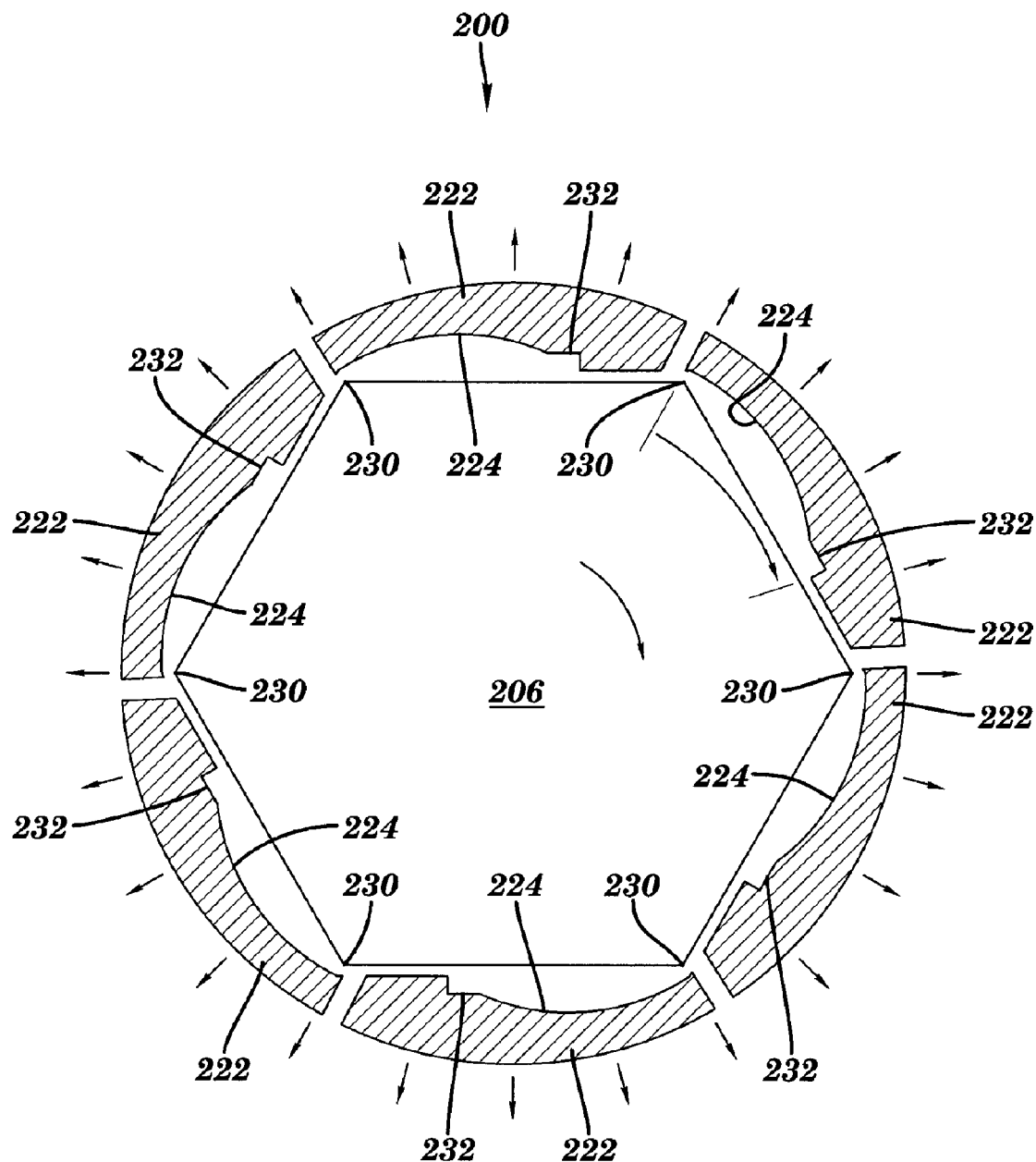
FIG. 7 shows a plan view of a second embodiment of a cam-action standoff connector according to the invention.
Figure 8:
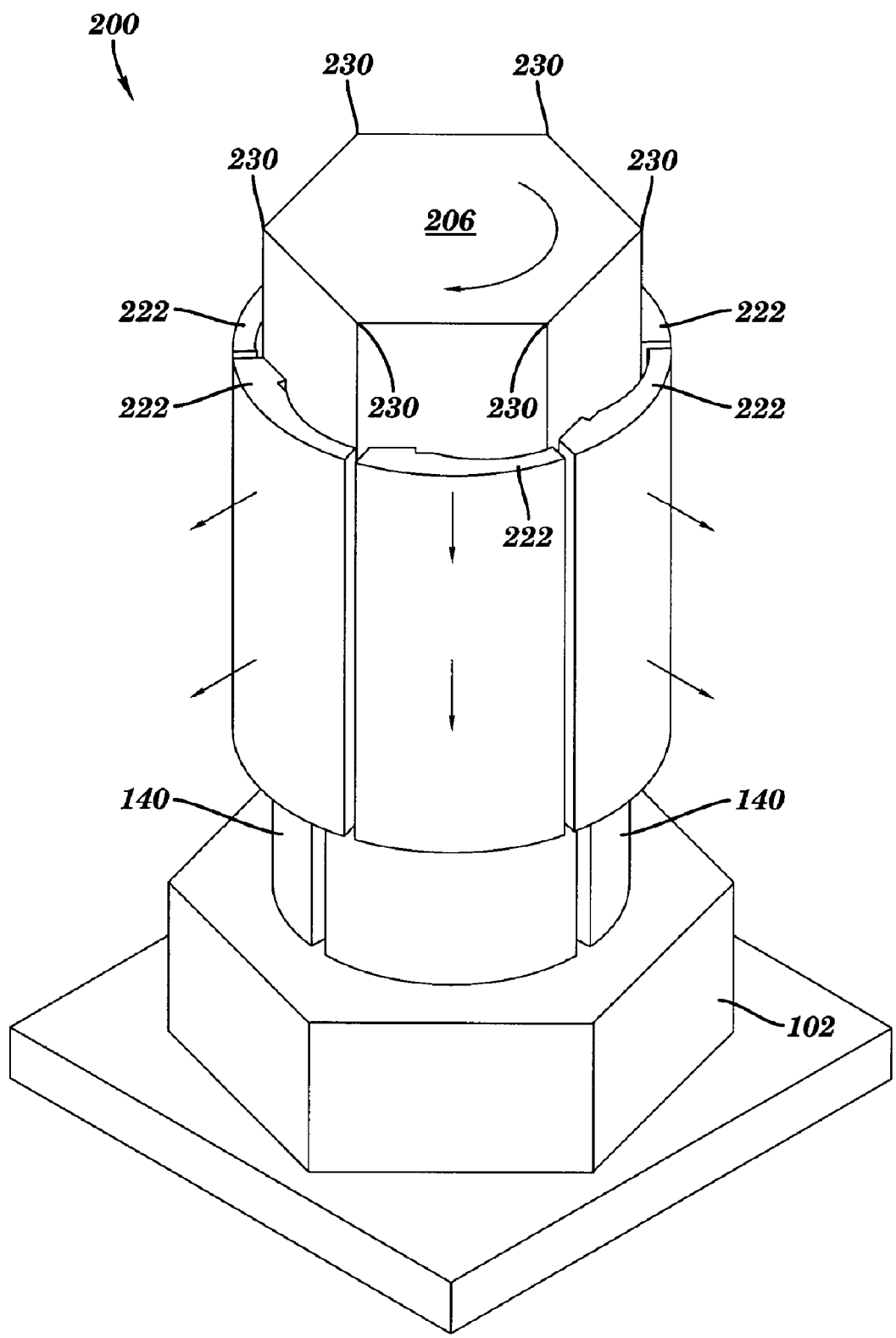
FIG. 8 shows a perspective view of the connector of FIG. 7.

FIGS. 3-5 illustrate an embodiment in which two mounting members 122 are provided and cam 106 has a substantially rectangular cross-section including two engagers 130, i.e., ends of rectangle. It should be recognized, however, that the invention is not limited to any particular number of mounting members and engagers. For example, FIGS. 7-8 illustrate a second embodiment of an expandable standoff connector 200 in which six mounting members 222 are provided, and cam 206 includes six engagers 230. In this embodiment, cam 206 has a hexagonal cross-section, which provides added advantages in that a standard nut driver can be used to rotate it and a more uniform force is applied during actuation. As in the previous embodiment, engager seats 232 may be provided on camming portions 224 to secure cam 206 in the second, actuated position. The location of the second position and the amount of rotation necessary to mount a circuit board will vary depending on the number of mounting members/engagers used. In FIGS. 3-5, the second positions are approximately 180° apart, and approximately 90° of cam 106 rotation is required for actuation. In FIGS. 7-8, the second positions are 60° apart, and approximately 30° of cam 206 rotation is required for actuation.

In each of the above-described embodiments, body 102 and mounting members 122, 222 are preferably made of a plastic, e.g., by injection molding, and cam 106, 206 is made of a harder material such as metal. When cam 106, 206 is made of metal, metal stamping, drawing or other low-cost production can be used to manufacture the cam.

Referring to FIGS. 3, 5 and 8, each mounting member 122, 222 may also include a reduced or relieved area 140 adjacent body 102 to improve flexibility and minimize non-uniform expansion.

The invention also includes a method for mounting a circuit board using an expandable standoff connector 100, 200. The method includes, first, mounting a body 102 of expandable standoff connector 100, 200 to chassis 110. Next, an engagement portion 104 of the above-described expandable standoff connector 100, 200 is inserted within interior 112 of mounting opening 114 of circuit board 116. A cam 106, 206, as described above, is provided within cam opening 120 either prior to the insertion of engagement portion 104 or after insertion. Finally, cam 106, 206 is moved (e.g., rotated) from the first, non-actuated position (FIGS. 3, 4, 7 and 8) in which mounting members 122, 222 are not expanded against interior 112 of mounting opening 114 to a second, actuated position (FIG. 5) in which each engager 130, 230 engages a corresponding camming portion 124, 224 to expand mounting members 122, 222 against interior 112 of mounting opening 114 to mount circuit board 116. The board is allowed to float to a best-fit position before locking in place. As described above, the inserting step includes providing each camming portion 124, 224 with a decreasing distance (D2 vs. D1) relative to a center 128 (FIG. 4) of cam opening 120 (FIG. 4) from the first position to the second position. The moving step may include securing cam 106, 206 in the second position by placing each engager 130, 230 in an engager seat 132, 232.

Standoff connectors 100, 200, as described above, are also easily removable by rotating cam 106, 206 from the second position to the first position, which allows easy removal of a circuit board for assembly rework or repair.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An expanding standoff connector for mounting a circuit board, the connector comprising:

a body adapted to be mounted to a chassis; an engagement portion coupled to the body for placement within an interior of a mounting opening of the circuit board, the engagement portion including a cam opening between a plurality of mounting members, each mounting member having an interior longitudinally-extending camming portion; and a cam including an interior longitudinally-extending engager for each camming portion;

wherein the cam is configured to be positioned in the cam opening within the interior of the mounting opening of the circuit board is moveable from first position in which the mounting members are not expanded against the interior of the mounting opening and in a second position in which each engager engages a corresponding camming portion to expand the plurality of mounting members against the interior of the mounting opening; wherein the expanding of the plurality of mounting members in the second position consists of forcing the plurality of mounting members radially against the interior of the mounting opening to mount the circuit board.

2. The connector of claim 1, wherein each camming portion has a decreasing distance relative to a center of the cam opening from the first position to the second position.

3. The connector of claim 1, wherein each camming portion has a first thickness at the first position relative to an exterior surface of a corresponding mounting member, and a second thickness at the second position relative to the exterior surface of the corresponding mounting member, wherein the second thickness is greater than the first thickness.

4. The connector of claim 1, wherein each camming portion further includes an engager seat for securing the cam in the second position.

5. The connector of claim 1, wherein each mounting member includes at least one spline on an exterior surface thereof.

6. The connector of claim 1, wherein the plurality of mounting members includes two mounting members, and the cam includes two engagers.

7. The connector of claim 1, wherein the plurality of mounting members includes six mounting members, and the cam includes six engagers and has a hexagonal cross-section.

8. The connector of claim 1, wherein each mounting member includes a relieved area adjacent the body.

9. The connector of claim 1, wherein the body and the plurality of mounting members are made of a plastic, and the cam is made of a harder material that the plastic.

10. An expanding standoff connector for mounting a circuit board, the connector comprising:

a body adapted to be mounted to a chassis; a plurality of mounting members extending from the body for placement within an interior of a mounting opening of the circuit board, the plurality of mounting members having a cam opening there between, each mounting member having an interior longitudinally-extending caroming portion having a decreasing distance relative to a center of the cam opening; and a cam for positioning in the cam opening within file interior of the mounting opening of the circuit board in a first position in which the mounting members are not expanded against the interior of the mounting opening, and for rotation to a second position in which the cam engages each camming portion to expand the plurality of mounting members against the interior of the mounting opening; wherein the expanding of the plurality of mounting members in the second position consists of forcing the plurality of mounting members radially against the interior of the mounting opening to mount the circuit board.

11. The connector of claim 10, wherein the plurality of mounting members includes two mounting members, and the cam includes two engagers.

12. The connector of claim 10, wherein the plurality of mounting members includes six mounting members, and the cam includes six engagers.

13. The connector of claim 12, wherein the cam has a hexagonal cross-section.

14. The connector of claim 10, wherein each camming portion further includes an engager seat for securing the cam in the second position.

15. The connector of claim 10, wherein each mounting member includes at least one spline on an exterior surface thereof.

16. The connector of claim 10, wherein the plurality of mounting members are made of a plastic, and the cam is made of a harder material.

* * * * *